United States Patent

Hashimoto et al.

Patent Number: 5,468,590
Date of Patent: Nov. 21, 1995

[54] POSITIVE RESIST COMPOSITION

[75] Inventors: Kazuhiko Hashimoto; Haruyoshi Osaki; Chinehito Ebina; Kyoko Nagase, all of Osaka; Hiroshi Moriuma, Nara; Yasunori Uetani, Osaka, all of Japan

[73] Assignee: Sumitomo Chemical Company, Limited, Osaka, Japan

[21] Appl. No.: 348,994

[22] Filed: Nov. 29, 1994

Related U.S. Application Data

[63] Continuation of Ser. No. 995,008, Dec. 22, 1992, abandoned.

Foreign Application Priority Data

Dec. 27, 1991 [JP] Japan .................... 3-346693

[51] Int. Cl.⁶ .................. G03F 7/023; G03F 7/30
[52] U.S. Cl. ................. 430/191; 430/165; 430/192; 430/193; 528/153; 528/155; 528/156
[58] Field of Search ................. 430/191, 192, 430/193, 165; 528/153, 155, 156

[56] References Cited

U.S. PATENT DOCUMENTS

| | | | |
|---|---|---|---|
| 4,738,915 | 4/1988 | Komine et al. | 430/193 |
| 4,920,028 | 4/1990 | Lazarus et al. | 430/192 |
| 5,177,172 | 1/1993 | Toukhy | 430/192 |

FOREIGN PATENT DOCUMENTS

| | | | |
|---|---|---|---|
| 358871 | 3/1990 | European Pat. Off. | 430/192 |
| 415266 | 3/1991 | European Pat. Off. | |
| 435181 | 7/1991 | European Pat. Off. | |

*Primary Examiner*—John S. Y. Chu
*Attorney, Agent, or Firm*—Birch, Stewart, Kolasch & Birch

[57] ABSTRACT

A positive resist composition containing a quinone diazide compound and an alkali-soluble resin which contains a resin (A) obtained by a condensation reaction of an aldehyde compound, at least one phenol compound of the formula:

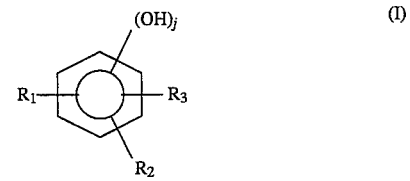

wherein $R_1$, $R_2$ and $R_3$ are independently a hydrogen atom, or a $C_1$–$C_4$ alkyl or alkoxy group, and j is 1 or 2, and at least one compound of the formula:

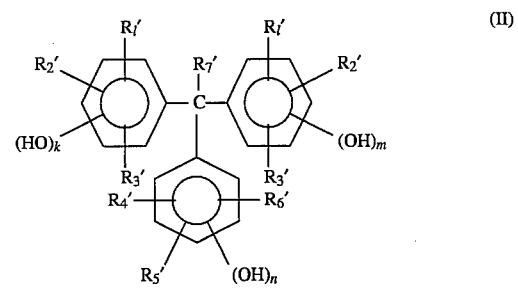

wherein $R'_1$, $R'_2$, $R'_3$, $R'_4$, $R'_5$ and $R'_6$ are independently a hydrogen atom, or a $C_1$–$C_4$ alkyl or alkoxy group, $R'_7$ is a hydrogen, a $C_1$–$C_4$ alkyl group or an aryl group, and k, m and n are independently 0, 1 or 2 provided that a sum of k, m and n is larger than 2, which composition is excellent in balance among various properties such as a profile, a sensitivity, heat resistance and a depth of focus.

16 Claims, 1 Drawing Sheet

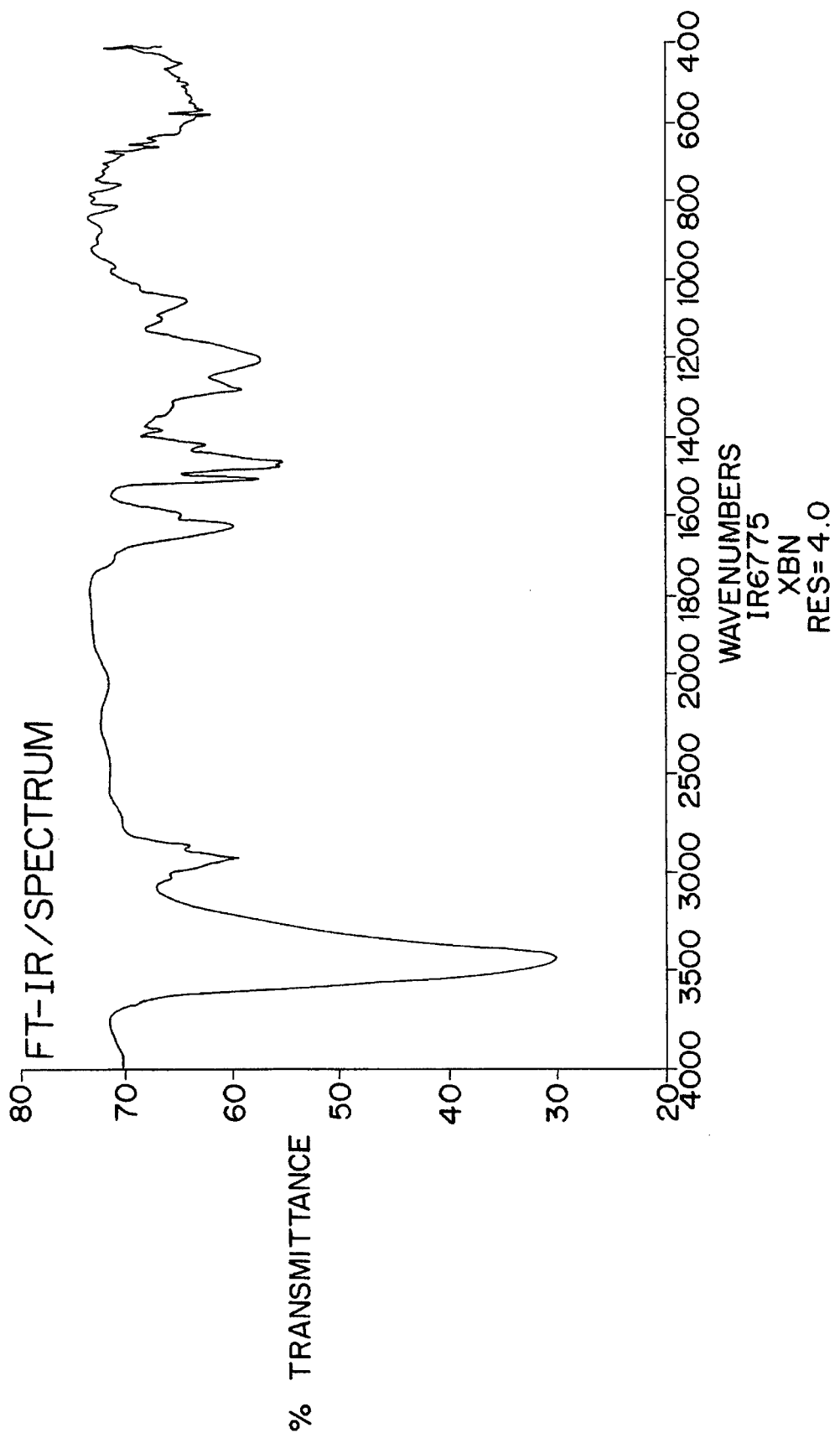

POSITIVE RESIST COMPOSITION

This application is a continuation of application Ser. No. 07/995,008, filed on Dec. 22, 1992, now abandoned.

BACKGROUND OF THE INVENTION

1. Field of the Invention

The present invention relates to a positive resist composition. More particularly, the present invention relates to a positive resist composition which is sensitive to ultraviolet light, far ultraviolet light including excimer laser, electron beam, ion beam, X-ray and the like.

2. Description of the Related Art

A composition containing a compound having a quinone diazide group and an alkali-soluble resin finds use as a positive resist because, upon exposure to light having a wavelength of 500 nm or shorter, the quinone diazide group decomposes to form a carboxyl group whereby the originally alkali-insoluble composition becomes alkali-soluble. Since the positive resist composition has much better resolution than a negative resist composition, it is used in the production of integrated circuits such as IC or LSI.

Recently, particularly with integrated circuit, miniaturization has proceeded with a rise in the integration level, which results in demands for formation of patterns of submicron order. To satisfy such demands, a step-and-repeat type reduction projection exposure apparatus, namely a stepper is used as an exposure apparatus. When a numerical aperture (NA) of a reduction projection lens of the stepper is increased, a resolution is increased while a depth of focus is decreased. Because of the step-and-repeat type, a throughput of the stepper is smaller than that with a batch exposure system. Therefore, the positive resist composition is required to have a much improved depth of focus and sensitivity in addition to good resolution, γ-value, profile and coating properties.

With the increase of the integration level of LSI, a distance between pattern lines is greatly decreased. To this end, etching is carried out mainly by dry etching in place of conventional wet etching. Therefore, the resist is required to have improved heat resistance.

When the currently used positive resists are checked from the above view points, they do not necessarily have the satisfactory depth of focus, sensitivity and heat resistance. In addition, the currently used resist tends to leave a developing residue (scum) on developed areas at a critical resolution, or provide a non-rectangular profile.

BRIEF DESCRIPTION OF THE DRAWING

FIGURE is an IR spectrum of the compound prepared in Reference Example 22.

SUMMARY OF THE INVENTION

An object of the present invention is to provide a positive resist composition which is excellent in various properties such as a profile, a sensitivity, heat resistance and a depth of focus.

According to the present invention, there is provided a positive resist composition comprising a quinone diazide compound and an alkali-soluble resin containing a resin (A) which is obtained by a condensation reaction of an aldehyde compound, at least one phenol compound of the formula:

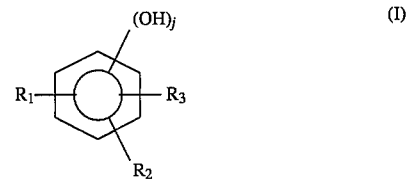

wherein $R_1$, $R_2$ and $R_3$ are independently a hydrogen atom, or a $C_1$–$C_4$ alkyl or alkoxy group, and j is 1 or 2, and at least one compound of the formula:

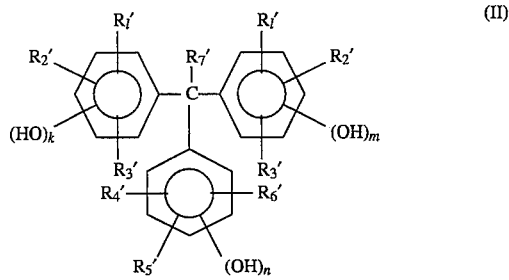

wherein $R'_1$, $R'_2$, $R'_3$, $R'_4$, $R'_5$ and $R'_6$ are independently a hydrogen atom, or a $C_1$–$C_4$ alkyl or alkoxy group, $R'_7$ is a hydrogen, a $C_1$–$C_4$ alkyl group or an aryl group, and k, m and n are independently 0, 1 or 2 provided that a sum of k, m and n is larger than 2.

DESCRIPTION OF THE INVENTION

Specific examples of the phenol compound of the formula (I) are phenol, o-cresol, m-cresol, p-cresol, 3,5-xylenol, 2,5-xylenol, 2,3,5-trimethylphenol, 4-tert.-butylphenol, 2-tert.-butylphenol, 3-tert.-butylphenol, 2-tert.-butyl-4-methylphenol, 2-tert.-butyl-5-methylphenol, 2-methylresorcinol, 4-methylresorcinol, 5-methylresorcinol, 4-tert.-butylcatechol, 4-methoxyphenol, 3-methoxyphenol, 2-methoxyphenol, 2-methoxycatechol, 2-methoxyresorcinol, 3-methoxyresorcinol, 2,3-dimethoxyphenol, 2,5-dimethoxyphenol, 3,5-dimethoxyphenol, 3-ethylphenol, 2-ethylphenol, 4-ethylphenol, 2,3,5-triethylphenol, 3,5-diethylphenol, 2,5-diethylphenol, and the like. Among them, m-cresol, p-cresol, 3,5-xylenol, 2,5-xylenol, 2,3,5-trimethylphenol and 2-tert.-butyl-5-methylphenol are preferred.

The phenol compounds are used independently or as a mixture of two or more of them. Examples of the mixtures are those of m-cresol and p-cresol; m-cresol and 3,5-xylenol; m-cresol and 2,5-xylenol; m-cresol and 2,3,5-trimethylphenol; m-cresol and 2-tert.-butyl-5-methylphenol; m-cresol, p-cresol and 3,5-xylenol; m-cresol, p-cresol and 2,5-xylenol; m-cresol, p-cresol and 2,3,5-trimethylphenol; m-cresol, p-cresol and 2-tert.-butyl-5-methylphenol; and the like.

A copolymerizable composition is suitably selected.

As the alkyl group for $R'_1$ to $R'_6$ in the formula (II), straight and branched ones may be used. A methyl group and an ethyl group are preferred.

As the aryl group for $R'_7$, substituted or unsubstituted ones may be used. Preferred substituents are an alkyl group and a hydroxyl group. Examples of the aryl group are a phenyl group, a naphthyl group, a benzyl group, a phenethyl group and the like.

Preferred examples of the compound (II) are

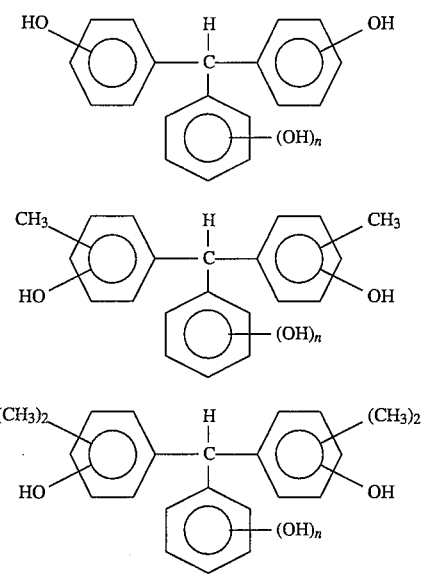

wherein n is the same as defined above.

Among them, the following compounds are particularly preferred:

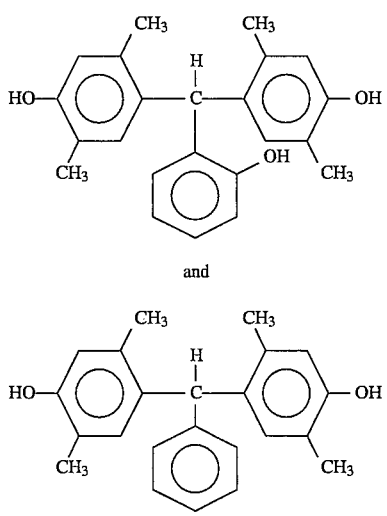

The compound of the formula (II) may be prepared by a known method, for example, a method disclosed in Japanese Patent Kokai Publication No. 275955/1990.

A preferred amount of the compound (II) is from 0.005 to 1 mole, more preferably 0.01 to 0.5 mole per one mole of the phenol compound (I).

Examples of the aldehyde to be reacted with the phenol compound (I) and the compound (II) are formaldehyde, acetaldehyde, propionaldehyde, n-butylaldehyde, isobutylaldehyde, trimethylacetaldehyde, n-hexylaldehyde, acrolein, crotonaldehyde, cyclohexanealdehyde, cyclopentanealdehyde, furfural, furylacrolein, benzaldehyde, o-tolualdehyde, p-tolualdehyde, m-tolualdehyde, p-ethylbenzaldehyde, 2,4-dimethylbenzaldehyde, 2,5-dimethylbenzaldehyde, 3,4-dimethylbenzaldehyde, 3,5-dimethylbenzaldehyde, phenylacetaldehyde, o-hydroxybenzaldehyde, p-hydroxybenzaldehyde, m-hydroxybenzaldehyde, cinnamaldehyde, o-anisaldehyde, p-anisaldehyde, m-anisaldehyde, vanillin, and the like.

The aldehydes are used independently or as a mixture of two or more of them.

In view of easy availability in an industrial scale, formaldehyde is preferred.

A preferred amount of the aldehyde is from 0.5 to 2 moles per one mole of the total amount of the phenol compound (I) and the compound (II).

In the condensation reaction, an acid catalyst may be used. Examples of the acid catalyst are inorganic acids (e.g. hydrochloric acid, sulfuric acid, perchloric acid, phosphoric acid, etc.), organic acids (e.g. formic acid, acetic acid, oxalic acid, trichloroacetic acid, p-toluene-sulfonic acid, etc.), divalent metal salts (e.g. zinc acetate, zinc chloride, magnesium acetate, etc.) and the like.

These acid catalysts may be used independently or as a mixture thereof.

An amount of the acid catalyst is from 0.005 to 2 moles per one mole of the total amount of the phenol compound (I) and the compound (II).

The condensation reaction is carried out at a temperature of 60° to 250° C. for 2 to 30 hours. The phenol compound, the compound (II), the aldehyde and the acid catalyst are charged at one time or part by part.

The condensation reaction is carried out in the presence or absence of a solvent.

Preferred examples of the solvent are water, alcohols (e.g. methanol, ethanol, isopropanol, n-butanol, isoamyl alcohol, etc.), ketones (e.g. methyl isobutyl ketone, methyl ethyl ketone, cyclohexanone, etc.), hydrocarbons (e.g. hexane, heptane, cyclohexane, benzene, toluene, xylene, etc.), methylcellosolve, ethylcellosolve, ethylcellosolve acetate, and the like.

An amount of the solvent is usually from 10 to 1000 parts by weight per 100 parts by weight of the total amount of the phenol compound (I) and the compound (II).

As the resin (A), a resin having an area in a GPC pattern (measured using a detector for UV of 254 nm) of a range in that a molecular weight as converted to polystyrene is not larger than 1000 not exceeding 30% of a whole pattern area excluding the unreacted phenol compounds is preferred. In view of the improvement of heat resistance and suppression of the formation of scum, a resin having an area in a GPC pattern of a range in that a molecular weight as converted to polystyrene is not larger than 6000 being from 15% to 65% of a whole pattern area excluding the unreacted phenol compounds is further preferred.

Such preferred resin (A) can be obtained by a known fractionation method. For example, the resin prepared by the condensation reaction is dissolved in a good solvent such as alcohols (e.g. methanol, ethanol, etc.), ketones (e.g. acetone, methyl ethyl ketone, methyl isobutyl ketone, etc.), ethylene glycol or its ethers, ether esters (e.g. ethylcellosolve acetate, etc.), tetrahydrofuran and the like and pouring a resulting solution in water to precipitate the resin, or by pouring the solution in a solvent such as heptane or cyclohexane to separate it.

As the resin (A), one having a polystyrene-converted average molecular weight of 2000 to 20,000 in the GPC pattern is preferred.

A preferred alkali soluble resin contains both the resin (A) and a low molecular weight novolak resin (B) having a polystyrene-converted average molecular weight of 200 to 20,000 in the GPC pattern.

In a more preferred embodiment, the alkali-soluble resin satisfies the above conditions and also the resin (A) has an area in a GPC pattern of a range in that a molecular weight as converted to polystyrene is not larger than 1000 not exceeding 30% of a whole pattern area excluding the unreacted phenol compounds. Further, the alkali-soluble resin is particularly preferred, when the resin (A) has an area in a GPC pattern of a range in that a molecular weight as converted to polystyrene is not larger than 6000 being from 15% to 65% of a whole pattern area excluding the unreacted phenol compounds.

The low molecular weight novolak resin (B) can be prepared by reacting a phenol compound with an aldehyde such as formalin, paraformaldehyde, acetaldehyde, glyoxal and the like in the presence of the acid catalyst.

Specific examples of the phenol compound are phenol, o-cresol, m-cresol, p-cresol, 3,5-xylenol, 2,5-xylenol, 2,3-xylenol, 2,4-xylenol, 2,6-xylenol, 3,4-xylenol, 2,3,5-trimethylphenol, resorcinol, and the like. These phenol compounds may be used independently or as a mixture thereof by taking a solubility in the alkaline developing solution into consideration. Among them, o-cresol, m-cresol and p-cresol are preferred.

As the acid catalyst, those exemplified above can be used.

The reaction temperature is from 30° to 250° C. Other reaction conditions may be the same as those in the above described condensation reaction.

The low molecular weight novolak resin (B) has a polystyrene-converted average molecular weight (measured by GPC) of 200 to 2000, preferably 200 to 1000. When the average molecular weight exceeds 2000, the sensitivity of the positive resist composition decreases. When the average molecular weight is smaller than 200, adhesion of the resist to a substrate and heat resistance are deteriorated.

The average molecular weight of the low molecular weight novolak resin (B) can be easily controlled by adjusting a molar ratio of the aldehyde to the phenol compound. For example, the low molecular weight novolak resin (B) having the average molecular weight of 200 to 2000 can be prepared by reacting formaldehyde and m-cresol in a molar ratio (fromaldehyde/m-cresol) of 0.65:1 to 0.05:1. After the reaction, preferably unreacted monomers are removed by, for example, distillation.

A preferred amount of the low molecular weight novolak resin (B) is 4 to 50 parts by weight per 100 parts by weight of the whole amount of the alkali-soluble resins. When the amount of the low molecular weight novolak resin (B) is smaller than 4 parts by weight, the solubility of the resist composition in the alkaline developing solution decreases. When this amount exceeds 50 parts by weight, a part which is not irradiated is easily dissolved in the alkaline developing solution so that the patterning becomes difficult.

The preferred positive resist composition of the present invention contains, in addition to the alkali-soluble resin including the resin (A) and the quinone diazide compound, an additive compound of the formula:

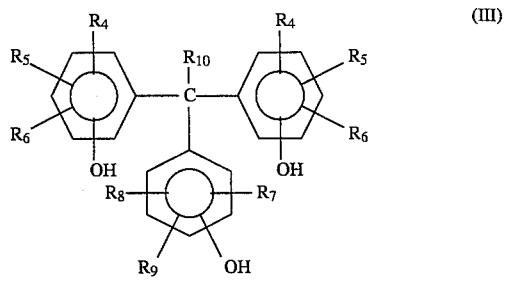

wherein $R_4$, $R_5$, $R_6$, $R_7$, $R_8$ and $R_9$ are independently a hydrogen atom, or a $C_1$–$C_4$ alkyl or alkoxy group, and $R_{10}$ is a hydrogen atom, a $C_1$–$C_4$ alkyl group or an aryl group.

The alkyl group for the $R_4$ to $R_9$ may be a straight or branched one and preferably a methyl group or an ethyl group. The aryl group for $R_{10}$ may be a substituted or unsubstituted aryl group. Preferred substituents are an alkyl group and a hydroxyl group. Examples of the aryl group are a phenyl group, a naphthyl group, a benzyl group, a phenethyl group and the like.

Preferred examples of the compound (III) are

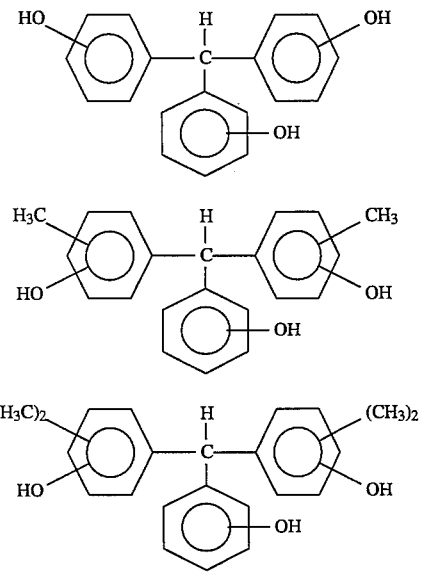

In particular, the following compounds are preferred as the compound (III):

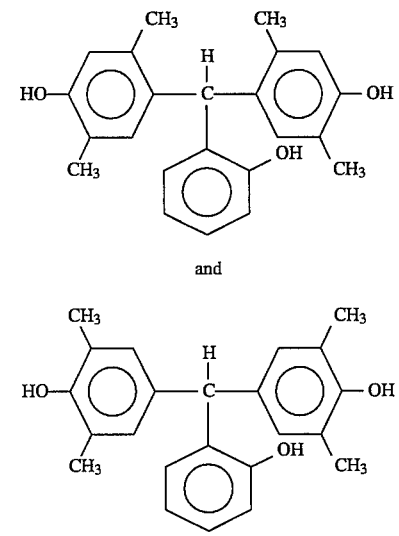

The compound of the formula (III) may be prepared by a known method, for example, a method disclosed in Japanese Patent Kokai Publication No. 275955/1990.

A preferred amount of the compound (III) is from 4 to 40 parts by weight per 100 parts of the total weight of the alkali-soluble resins.

Insofar as the effects of the present invention are not deteriorated, the alkali-soluble resin may contain other alkali-soluble resin in addition to the resin (A) and the low molecular weight novolak resin (B). Examples of the other alkali-soluble resins are a novolak resin other than the resin (A) and the low molecular weight novolak resin (B), and polyvinylphenol.

The novolak resin other than the resin (A) and the low molecular weight novolak resin (B) may be a resin prepared by reacting at least one phenol compound with formalin by a conventional method. Examples of the phenol compound to be used in the preparation the other novolak resin are phenol, o-cresol, m-cresol, p-cresol, 2,5-xylenol, 3,4-xylenol, 2,3,5-trimethylphenol, 4-tert.-butylphenol, 2-tert.-butylphenol, 3-tert.-butylphenol, 2-tert.-butyl-5-methylphenol, 3-ethylphenol, 2-ethylphenol, 4-ethylphenol, 4-naphthol, 1,3-dihydroxynaphthalene, 1,5-dihydroxynaphthalene, 1,7-dihydroxynaphthalene and a mixture thereof.

As the quinone diazide compound, any of the conventionally used compounds can be used. Examples of the quinone diazide compound are 1,2-benzoquinonediazide-4-sulfonic acid esters, 1,2-naphthoquinonediazide-4-sulfonic acid esters, 1,2-naphthoquinonediazide-5-sulfonic acid esters and the like. These esters may be prepared by a condensation reaction of a quinonediazidesulfonic acid such as benzoquinonediazidesulfonic acid or 1,2-naphthoquinonediazidesulfonic acid, or their halides (e.g. chlorides) with a compound having a hydroxyl group in the presence of a weak alkali.

Specific examples of the compound having a hydroxyl group are hydroquinone, resorcinol, phloroglucin, 2,4-dihydroxybenzophenone, trihydroxybenzophenones (e.g. 2,3,4-trihydroxybenzophenone, 2,2',3-trihydroxybenzophenone, 2,2',4-trihydroxybenzophenone, 2,2',5-trihydroxybenzophenone, 2,3,3'-trihydroxybenzophenone, 2,3,4'-trihydroxybenzophenone, 2,3',4-trihydroxybenzophenone, 2,3',5-trihydroxybenzophenone, 2,4,4'-trihydroxybenzophenone, 2,4',5-trihydroxybenzophenone, 2',3,4-trihydroxybenzophenone, 3,3',4-trihydroxybenzophenone, 3,4,4'-trihydroxybenzophenone, etc.), tetrahydroxybenzophenones (e.g. 2,3,3',4-tetrahydroxybenzophenone, 2,3,4,4'-tetrahydroxybenzophenone, 2,2',4,4'-tetrahydroxybenzophenone, 2,2',3,4-tetrahydroxybenzophenone, 2,2',3,4'-tetrahydroxybenzophenone, 2,2',5,5'-tetrahydroxybenzophenone, 2,3',4',5-tetrahydroxybenzophenone, 2,3',5,5'-tetrahydroxybenzophenone, etc.), pentahydroxybenzophenones (e.g. 2,2',3,4,4'-pentahydroxybenzophenone, 2,2',3,4,5'-pentahydroxybenzophenone, 2,2',3,3',4-pentahydroxybenzophenone, 2,3,3',4,5'-pentahydroxybenzophenone, etc.), hexahydroxybenzophenones (e.g. 2,3,3',4,4',5'-hexahydroxybenzophenone, 2,2',3,3',4,5'-hexahydroxybenzophenone, etc.), alkyl gallates, oxyfravans disclosed in Japanese Patent Kokai Publication No. 84650/1990 (corresponding to U.S. Pat. No. 5,059,507), phenol compounds disclosed in Japanese Patent Kokai Publication No. 269351/1990 (corresponding to European Patent Publication No. 341 608A), a phenol compound of the formula:

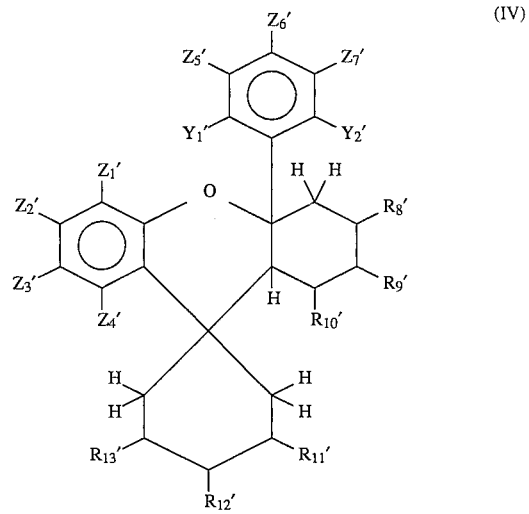

wherein $Y'_1$, $Y'_2$, $Z'_1$, $Z'_2$, $Z'_3$, $Z'_4$, $Z'_5$, $Z'_6$ and $Z'_7$ are independently a hydrogen atom, a hydroxyl group or a $C_1$–$C_4$ alkyl group provided that at least one of $Y'_1$ and $Y'_2$ is a hydroxyl group and at least two of $Z'_1$, $Z'_2$, $Z'_3$, $Z'_4$, $Z'_5$, $Z'_6$ and $Z'_7$ are hydroxyl groups, $R'_8$ to $R'_{13}$ are independently a hydrogen atom, a hydroxyl group, a $C_1$–$C_{10}$ alkyl group, a $C_2$–$C_4$ alkenyl group, a $C_5$–$C_8$ cycloalkyl group or an aryl group, and a phenol compound of the formula:

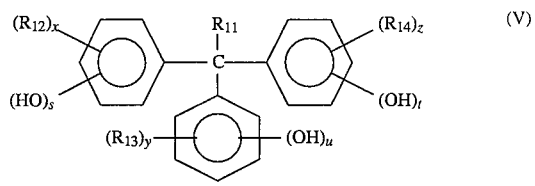

wherein $R_{11}$, $R_{12}$, $R_{13}$ and $R_{14}$ are independently a hydrogen atom, an alkyl group, an alkenyl group, an alkoxy group or an aryl group, and s, t and u are independently 0, 1, 2, 3 or 4 provided that a sum of s, t and u is at least 2, and x, y and z are independently 0, 1, 2, 3 or 4.

Particularly preferred examples of the quinone diazide compound are an oxyfravan of the formula:

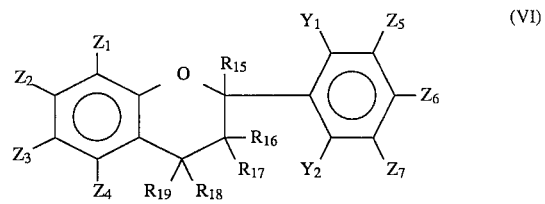

wherein $Y_1$ and $Y_2$ are independently a hydrogen atom, a hydroxyl group or a $C_1$–$C_4$ alkyl group provided that at least one of them is a hydroxyl group, $Z_1$, $Z_2$, $Z_3$ $Z_4$, $Z_5$, $Z_6$ and $Z_7$ are independently a hydrogen atom, a halogen atom, a hydroxyl group, a $C_1$–$C_4$ alkyl group, a $C_5$–$C_8$ cycloalkyl group or an aryl group provided that at least two of them are hydroxyl groups, and $R_{15}$, $R_{16}$, $R_{17}$, $R_{18}$, and $R_{19}$ are independently a hydrogen atom, a $C_1$–$C_{10}$ alkyl group, a $C_2$–$C_4$ alkenyl group, a cyclohexyl group or an aryl group provided that at least one of $R_{18}$ and $R_{19}$ is a $C_1$–$C_{10}$ alkyl group, a $C_2$–$C_4$ alkenyl group, a cyclohexyl group or an aryl group; and a condensation product of the phenol compound (V) and 1,2-naphthoquinonediazide-5-sulfonic acid which has at least two ester group on the average.

The quinone diazide compounds may be used independently or as a mixture of two or more of them.

An amount of the quinone diazide compound is from 5 to 50% by weight, preferably from 10 to 40% by weight of the total weight of all the alkali-soluble resin and the optionally used compound (III).

A solvent in which the components are dissolved is preferably one that evaporates at a suitable drying rate to give a uniform and smooth coating film. Such solvent includes glycoletheresters such as ethylcellosolve acetate and propyleneglycolmonomethylether acetate, solvents disclosed in Japanese Patent Kokai Publication No. 220056/ 1990, esters (e.g. ethyl pyruvate, n-amyl acetate, ethyl lactate, etc.), ketones (e.g. 2-heptanone, etc.), lactones (e.g. γ-butyrolactone, etc.) and the like. They may be used independently or as a mixture thereof.

An amount of the solvent is not limited insofar as the composition can form a uniform film on a wafer without pinholes or coating irregularity. Usually, the amount of the solvent is adjusted so that the solid content, namely the quinone diazide compound and the alkali-soluble resins in the positive resist composition is from 3 to 50% by weight.

If necessary, the positive resist composition may contain any of conventionally used additives such as a sensitizer, other resin, a surfactant, a stabilizer or a dye.

The positive resist composition of the present invention is excellent in a balance among various properties such as a profile, a sensitivity, heat resistance and a depth of focus.

PREFERRED EMBODIMENTS OF THE INVENTION

The present invention will be illustrated by following Examples which do not intended to limit the scope of the present invention.

Reference Example 1

In toluene (268 g), 2,5-xylenol (134 g) and salicylaldehyde (33.7 g) were reacted in the presence of p-toluenesulfonic acid (0.83 g) at 115° C. for 16 hours while removing water formed by condensation. After cooling the reaction mixture down to 50° to 60° C., the mixture was filtrated at the same temperature to obtain a crude cake of a compound of the formula:

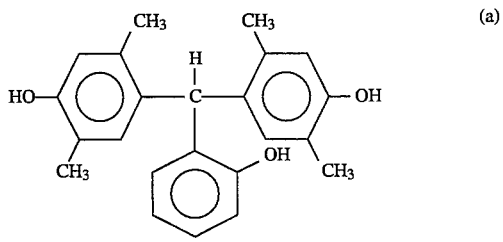

(a)

as one of the phenol compound (II).

The crude cake was dissolved in methanol (580 g) at room temperature and poured in ion-exchanged water (1450 g). A precipitated material was recovered by filtration and dried to obtain a pure cake (89.3 g).

Reference Example 2

In methanol (733 g), 2,5-xylenol (733 g) and benzaldehyde (212 g) were reacted in the presence of p-toluenesulfonic acid (21 g) at 60° C. for 8 hours. The reaction mixture was poured in toluene (700 g) and a precipitated material was recovered by filtration and washed to obtain a crude cake of a compound of the formula:

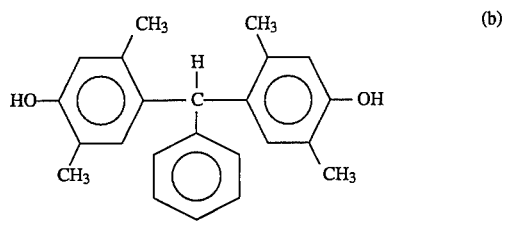

(b)

as one of the phenol compound (II).

The crude cake was dissolved in a mixture of methanol (400 g) and acetone (200 g) at a slightly elevated temperature and then cooled. A precipitated material was recovered by filtration and dried to obtain a pure cake (5933 g).

Reference Examples 3–15

To a mixture of the pure cake of the compound (a) obtained in Reference Example 1 (52.2 g), m-cresol (40.6 g), p-cresol (40.6 g), methyl isobutyl ketone (133 g), 12% oxalic acid (30 g) and 90% acetic acid (68 g), 37% formalin (38.5 g) was dropwise added at 95° C. over 1 hour while stirring. After the addition of formalin, the mixture was further reacted at the same temperature for 15 hours. The reaction mixture was washed with water and dehydrated to obtain a novolak resin dissolved in methyl isobutyl ketone. The novolak resin had a polystyrene-converted weight average molecular weight of 4980 measured by GPC.

In the same manner as above except that the monomers and compositions were changed as shown in Table 1, resins shown in Table 1 were prepared.

Reference Examples 16–28

A solution of the novolak resin in methyl isobutyl ketone prepared in Reference Example 3 (a novolak resin content of 40.67%) (106.4 g), methyl isobutyl ketone (164 g) and n-heptane (209.7 g) were stirred at 60° C. for 30 minutes and kept standing to separate it. To a lower layer, 2-heptanone (150 g) was added and the mixture was concentrated by an evaporator to obtain a solution of a novolak resin in 2-heptanone.

The novolak resin had a polystyrene-converted weight average molecular weight of 8950 measured by GPC. An area in a GPC pattern of a range in that a molecular weight as converted to polystyrene is not larger than 6000 was 37.5% of a whole pattern area excluding the unreacted phenol compounds, and an area in that the molecular weight is not larger than 1000 was 9.9%.

In the same manner as above except that the compounds and compositions were changed as shown in Table 2, resins shown in Table 2 were prepared.

TABLE 1

| Ref. Example No. | Molar ratio | | Compound (II) | M.W. |
|---|---|---|---|---|
| | Phenol compound (I) | | | |
| 3 | m-Cresol (40) | p-Cresol (40) | — | (a) (20) | 4980 |
| 4 | m-Cresol | p-Cresol | — | (a) (10) | 4550 |

TABLE 1-continued

| Ref. Example No. | Molar ratio Phenol compound (I) | | | Compound (II) | M.W. |
|---|---|---|---|---|---|
| 5 | m-Cresol (40) | p-Cresol (50) | — | (a) (20) | 4720 |
| 6 | m-Cresol (30) | p-Cresol (50) | — | (a) (30) | 4630 |
| 7 | m-Cresol (20) | p-Cresol (50) | — | (b) (20) | 4240 |
| 8 | m-Cresol (50) | p-Cresol (30) | — | (b) (20) | 4420 |
| 9 | m-Cresol (60) | p-Cresol (20) | 2-tert.-butyl-5-methylphenol (2.5) | (a) (10) | 4360 |
| 10 | m-Cresol (50) | p-Cresol (50) | 2-tert.-butyl-5-methylphenol (1) | (a) (2.5) | 4050 |
| 11 | m-Cresol (49) | p-Cresol (51) | 2-tert.-butyl-5-methylphenol (1) | (a) (25) | 4160 |
| 12 | m-Cresol (38) | p-Cresol (62) | 2-tert.-butyl-5-methylphenol (5) | (a) (11.1) | 4090 |
| 13 | m-Cresol (55) | p-Cresol (45) | 2,3,5-tri-methylphenol (10) | (a) (20) | 5230 |
| 14 | m-Cresol (50) | p-Cresol (20) | 2,3,5-tri-methylphenol (10) | (b) (15) | 4060 |
| 15 | m-Cresol (60) | p-Cresol (15) | — | — | 4550 |
|  | m-Cresol (50) | p-Cresol (50) |  |  |  |

TABLE 2

| Ref. Example No. | Used resin (Ref. Ex. No.) | Weight av. molecular weight | Area ratio α*1 (%) | Area ratio β*2 (%) |
|---|---|---|---|---|
| 16 | No. 3 | 8950 | 37.5 | 9.9 |
| 17 | No. 4 | 9650 | 37.4 | 9.0 |
| 18 | No. 5 | 10080 | 38.5 | 8.1 |
| 19 | No. 6 | 9330 | 35.9 | 9.0 |
| 20 | No. 7 | 12200 | 36.0 | 9.7 |
| 21 | No. 8 | 9270 | 39.5 | 9.5 |
| 22 | No. 9 | 9180 | 40.6 | 11.8 |
| 23 | No. 10 | 9850 | 36.8 | 10.9 |
| 24 | No. 11 | 10480 | 39.4 | 12.7 |
| 25 | No. 12 | 10200 | 41.4 | 9.7 |
| 26 | No. 13 | 8660 | 41.7 | 9.4 |
| 27 | No. 14 | 9680 | 39.2 | 9.9 |
| 28 | No. 15 | 9850 | 37.1 | 9.9 |

Note:
*1 A ratio of an area in a GPC pattern of a range in that a molecular weight as converted to polystyrene is not larger than 6000 to a whole pattern area excluding the unreacted phenol compounds.
*2 A ratio of an area in a GPC pattern of a range in that a molecular weight as converted to polystyrene is not larger than 1000 to a whole pattern area excluding the unreacted phenol compounds.

An IR spectrum of the compound prepared in Reference Example 22 is shown in FIGURE.

Examples 1–12 and Comparative Example 1

Each of the novolak resins prepared in Reference Examples 16–28, a quinonediazide compound and a compound (c) as the compound (III) were mixed and dissolved in 2-heptanone and γ-butyrolactone. Amounts of the solvents were selected so that a film thickness of 1.05 μm was obtained under the below described coating conditions. The solution was filtrated through a polytetrafluoroethylene filter having a pore size of 0.2 μm to obtain a resist solution. Using a spinner, this resist solution was coated at 4000 rpm on a silicon wafer which had been rinsed in a usual way. Subsequently, the silicon wafer was baked at 100° C. for one minutes on a vacuum suction type hot plate, and exposed to light while varying the exposure time stepwise by means of a reduction projection exposing apparatus having a ultra high pressure mercury lamp as a light source (NSR 1775i 7A manufactured by Nicon). Thereafter, the silicon wafer was developed for one minute in a developing solution (SOPD manufactured by Sumitomo Chemical Co., Ltd.) to obtain a positive pattern.

Then, a cross section of the line-and-space pattern of 0.4 μm was observed by a scanning electron microscope. From an exposure time at which the line and space ratio 1:1 was achieved at the best focus, sensitivity was evaluated.

A profile was observed on a pattern form at the above exposure amount.

A depth of focus was determined by measuring a degree of focus shifting at which the 0.4 μm line-and-space pattern could be resolved at the above exposure amount without film thickness decrease.

Resolution was evaluated from the minimum line and space width which was separated without film thickness decrease at the above exposure amount.

A film thickness retention was calculated from a remaining film thickness in the unexposed part.

Heat resistance was evaluated by heating the silicon wafer having the developed resist pattern in a clean oven set at various temperatures in an air for 30 minutes and again observing the resist pattern by the scanning electron microscope, whereby a temperature at which the resist pattern started to deform was recorded.

The results are shown in Table 3.

As understood from these results, the positive resist composition of the present invention is excellent in the balance of the properties, in particular, heat resistance.

TABLE 3

| Example No. | Resist composition (pbw) | | | Resist properties | | | | | |
|---|---|---|---|---|---|---|---|---|---|
| | Novolak Resin, Re. Ex. No. | Compound (c)*1 | Quinone diazide compound | Sensitivity (msec) | Film thickness retention (%) | Resolution (μm) | Depth of focus (μm) | Heat resistance (°C.) | Profile |
| 1 | 16 (10.43) | 3.9 | (d)*2 (2.7) | 280 | 100 | 0.375 | 1.05 | 175 | ⊓ |
| 2 | 17 (10.43) | 3.9 | (d) (2.7) | 350 | 100 | 0.35 | 1.05 | 165 | ↑ |
| 3 | 18 (10.43) | 3.9 | (d) (2.7) | 330 | 100 | 0.35 | 1.05 | 170 | ↑ |
| 4 | 19 (10.43) | 3.9 | (d) (2.7) | 300 | 100 | 0.35 | 1.05 | 170 | ↑ |
| 5 | 20 (10.43) | 3.9 | (d) (2.7) | 540 | 100 | 0.35 | 1.05 | 170 | ↑ |
| 6 | 21 (10.43) | 3.9 | (d) (2.7) | 490 | 100 | 0.35 | 1.05 | 170 | ↑ |
| 7 | 22 (10.23) | 4.1 | (e)*3 (0.5) (f)*4 (3.5) | 380 | 100 | 0.35 | 1.35 | 165 | ⊓ |
| 8 | 23 10.23 | 4.1 | (e) (0.5) (f) (3.5) | 460 | 100 | 0.35 | 1.35 | 165 | ⊓ |
| 9 | 24 (10.23) | 4.1 | (e) (0.5) (f) (3.5) | 360 | 100 | 0.35 | 1.05 | 170 | ↑ |
| 10 | 25 (10.23) | 4.1 | (e) (0.5) (f) (3.5) | 460 | 100 | 0.375 | 1.05 | 170 | ↑ |
| 11 | 26 (10.43) | 3.9 | (d) (2.7) | 320 | 100 | 0.35 | 1.05 | 170 | ⊓ |
| 12 | 27 (10.43) | 3.9 | (d) (2.7) | 750 | 100 | 0.375 | 1.05 | 170 | ↑ |
| Comp. Ex. 1 | 28 (10.43) | 4.1 | (d) (2.7) | 320 | 100 | 0.375 | 0.9 | 160 | ⊓ |

Notes:
*1) Compound (c):

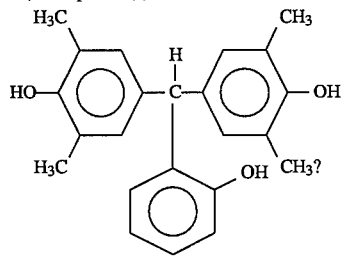

*2) Quinone diazide compound (d): A condensation product of naphthoquinone-(1,2)-diazide-(2)-5-sulfonyl chloride with the following compound (a molar ratio of 2.8:1):

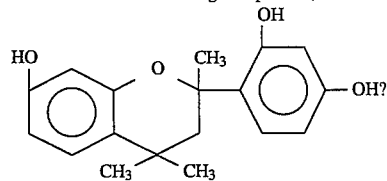

in which 2.8 hydroxyl groups on the average were esterified.

*3) Quinone diazide compound (e): A condensation product of naphthoquinone-(1,2)-diazide-(2)-5-sulfonyl chloride with the following compound (a molar ratio of 3:1):

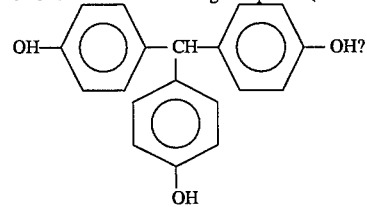

in which 3 hydroxyl groups on the average were esterified.

*4) Quinone diazide compound (f): A condensation product of naphthoquinone-(1,2)-diazide-(2)-5-sulfonyl chloride with the following compound (a molar ratio of 2:1):

TABLE 3-continued

| | Resist composition (pbw) | | | Resist properties | | | | | |
|---|---|---|---|---|---|---|---|---|---|
| Example No. | Novolak Resin, Re. Ex. No. | Compound (c)*[1] | Quinone diazide compound | Sensitivity (msec) | Film thickness retention (%) | Resolution (μm) | Depth of focus (μm) | Heat resistance (°C.) | Profile |

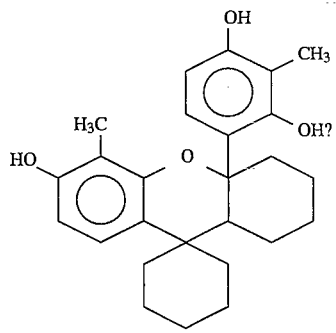

in which two hydroxyl groups on the average were esterified.

What is claimed is:

1. A positive resist composition comprising, in admixture, a photoimaging amount of a quinone diazide compound and a bindingly effective amount of an alkali-soluble resin containing a resin (A) which is obtained by a condensation reaction of an aldehyde compound, at least one phenol compound of the formula:

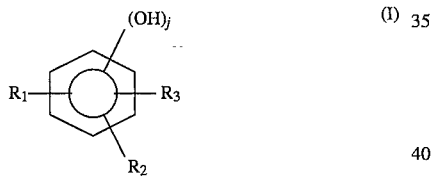

wherein $R_1$, $R_2$ and $R_3$ are independently a hydrogen atom, or a $C_1$–$C_4$ alkyl or alkoxy group, and j is 1 or 2, and at least one compound of the formula:

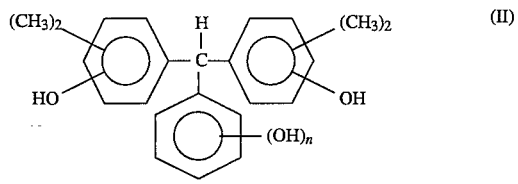

wherein n is 0, 1 or 2 wherein said resin (A) has an area of a GPC pattern for the molecular weight, as converted to polystyrene, of not larger than 1000, said area not exceeding 30% of the whole pattern area, excluding the unreacted phenol compound.

2. The positive resist composition according to claim 1, wherein said compound of the formula (II) is a compound selected from the group consisting of

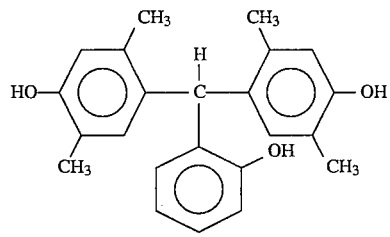

and

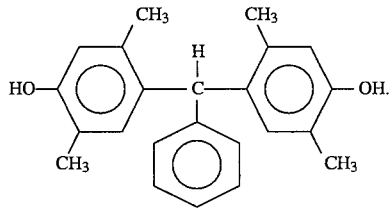

3. The positive resist composition according to claim 1, wherein said phenol compound of the formula (I) is a phenol compound selected from the group consisting of m-cresol, p-cresol, 3,5-xylenol, 2,5-xylenol, 2,3,5-trimethylphenol and 2-tert-butyl-5-methylphenol.

4. The positive resist composition according to claim 1, wherein said resin (A) has an area of a GPC pattern for the molecular weight, as converted to polystyrene, of not larger than 6000, said area being from 15% to 65% of the whole pattern area, excluding the unreacted phenol compounds.

5. The positive resist composition according to claim 1, wherein said resin (A) has a polystyrene-converted average molecular weight of 2000 to 20,000 in the GPC pattern.

6. The positive resist composition according to claim 1, which further comprises, as an alkali-soluble resin, a low molecular weight novolak resin (B) having a polystyrene-converted average molecular weight of 200 to 2,000 in the GPC pattern, in an amount of from 4 to 50 parts by weight per 100 parts by weight of the total amount of the alkali-soluble resins.

7. The positive resist composition according to claim 6, wherein said low molecular weight novolak resin (B) is a cresol novolak resin.

8. The positive resist composition according to claim 6, wherein said low molecular weight novolak resin (B) has a polystyrene-converted average molecular weight of 200 to 1000 in the GPC pattern.

9. The positive resist composition according to claim 1, which further comprises a compound of the formula:

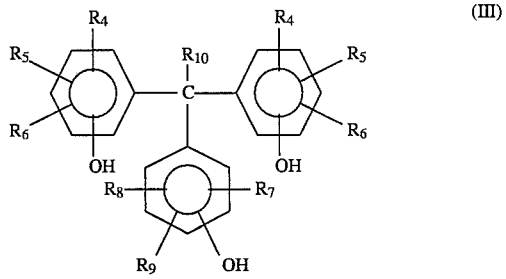

(III)

wherein $R_4$, $R_5$, $R_6$, $R_7$, $R_8$ and $R_9$ are independently a hydrogen atom, or a $C_1$–$C_4$ alkyl or alkoxy group, and $R_{10}$ is a hydrogen atom, a $C_1$–$C_4$ alkyl group or an aryl group.

10. The positive resist composition according to claim 9, wherein said compound of the formula (III) is a compound selected from the group consisting of

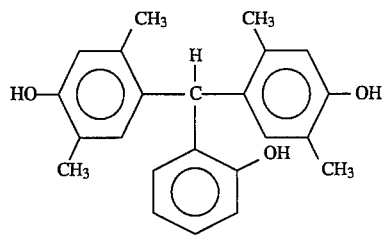

and

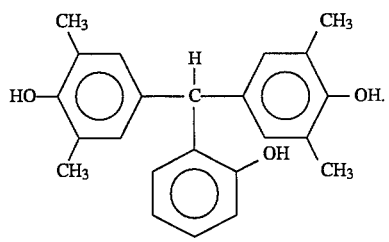

11. The positive resist composition according to claim 9, wherein an amount of said compound of the formula (III) is from 4 to 40 parts by weight per 100 parts by weight of the total amount of the alkali-soluble resins.

12. The positive resist composition according to claim 9, wherein said compound of the formula (III) is

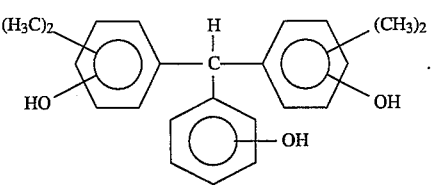

13. The positive resist composition according to claim 9, wherein said compound of the formula (III) is

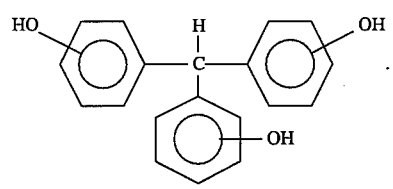

14. The positive resist composition according to claim 9, wherein said compound of the formula (III) is

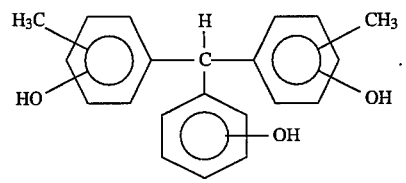

15. The positive resist composition according to claim 1, wherein the quinone diazide compound is present in an amount of from 5 to 50% by weight of the total weight of all the alkali-soluble resin.

16. The positive resist composition according to claim 1, wherein the quinone diazide compound is present in an amount of from 10 to 40% by weight of the total weight of all the alkali-soluble resin.

* * * * *